United States Patent
Oshida et al.

(10) Patent No.: US 7,372,478 B2
(45) Date of Patent: May 13, 2008

(54) PATTERN EXPOSURE METHOD AND PATTERN EXPOSURE APPARATUS

(75) Inventors: Yoshitada Oshida, Ebina (JP); Yoshitatsu Naito, Ebina (JP); Mituhiro Suzuki, Ebina (JP); Bunji Uchiyama, Ebina (JP); Tsuyoshi Yamaguchi, Ebina (JP)

(73) Assignee: Hitachi Via Mechanics, Ltd., Ebina-shi (JP)

(*) Notice: Subject to any disclaimer, the term of this patent is extended or adjusted under 35 U.S.C. 154(b) by 7 days.

(21) Appl. No.: 11/075,245

(22) Filed: Mar. 9, 2005

(65) Prior Publication Data
US 2005/0219496 A1    Oct. 6, 2005

(30) Foreign Application Priority Data
Mar. 31, 2004 (JP) ............ 2004-107662
Jun. 25, 2004 (JP) ............ 2004-189017

(51) Int. Cl.
*B41J 2/47* (2006.01)
*G03B 27/54* (2006.01)

(52) U.S. Cl. .................. 347/234; 355/67
(58) Field of Classification Search .......... 347/234; 359/205–207; 372/43, 9, 101; 355/67, 69
See application file for complete search history.

(56) References Cited

U.S. PATENT DOCUMENTS

| | | | | |
|---|---|---|---|---|
| 5,055,663 A | * | 10/1991 | Morimoto et al. | 250/201.4 |
| 6,242,754 B1 | * | 6/2001 | Shiraishi | 250/548 |
| 7,034,973 B2 | * | 4/2006 | Sakai | 359/205 |
| 2002/0063770 A1 | * | 5/2002 | Takesue | 347/234 |
| 2005/0063435 A1 | * | 3/2005 | Imai et al. | 372/43 |

* cited by examiner

*Primary Examiner*—Henry Hung Nguyen
(74) *Attorney, Agent, or Firm*—Crowell & Moring LLP

(57) ABSTRACT

A pattern exposure method and a pattern exposure apparatus in which the throughput is improved with an inexpensive apparatus and without a low running cost. Output faces of a plurality of laser beams emitted from a plurality of semiconductor lasers respectively are arranged in two directions. One of the directions is the same direction as the scanning direction of a polygon mirror while the other is a direction crossing the scanning direction of the polygon mirror. In this event, the array pitch of the output faces arranged in the direction crossing the scanning direction of the polygon mirror is made equal to resolution of an exposure pattern. In this event, the wavelength of each laser may be made not longer than 410 nm.

13 Claims, 16 Drawing Sheets

FIG. 23B1　　FIG. 23B2

PATTERN EXPOSURE METHOD AND PATTERN EXPOSURE APPARATUS

FIELD OF THE INVENTION

The present invention relates to a maskless pattern exposure method and a maskless pattern exposure apparatus using semiconductor lasers as light sources.

BACKGROUND ART

In the background art, for pattern exposure on a printed circuit board, a TFT substrate or a color filter substrate of a liquid crystal display or a substrate of a plasma display (hereinafter referred to as "substrate"), a mask serving as a master pattern is produced, and the substrate is exposed to light through the mask by a mask exposure apparatus.

In recent years, in spite of increasing dimensions of substrates, the time allotted to design and production of these substrates becomes shorter and shorter. When the substrates are designed, it is very difficult to eliminate design errors perfectly. Exposure is often performed with another mask produced newly on revised design. In addition, some kinds of substrates are often produced in a multi-item small-quantity production manner. The situation that a mask is produced for each of many kinds of substrates has been inevitable though it should be avoided in terms of the cost, the date of delivery, etc.

In consideration of the aforementioned situation, the request for maskless exposure using no mask is increasing in recent years. One of methods for performing maskless exposure is a method in which a two-dimensional pattern generated by use of a two-dimensional spatial modulator such as a liquid crystal or a DMD (Digital Mirror Device), and a substrate is exposed to light with the two-dimensional pattern through a projection lens (Japanese Patent Laid-Open No. 320968/1999). In addition, there is a method in which a substrate is scanned with a laser beam by use of a high-power laser and a polygon mirror and exposed to the laser beam by use of an EO modulator or an AO modulator. Thus, the substrate is patterned.

However, in the former background-art method, a comparatively fine pattern can be drawn, but the apparatus is expensive.

On the other hand, in the latter background-art method, substrates can be produced at a comparatively low cost due to a simple configuration of the apparatus, but it is difficult to pattern a large area with high definition. In addition, since a high-power laser is required in order to improve the throughput, the apparatus cost increases, and the running cost also increases.

SUMMARY OF THE INVENTION

In order to solve the foregoing problems, an object of the invention is to provide a pattern exposure method and a pattern exposure apparatus in which the throughput is improved with an inexpensive apparatus and at a low running cost.

In order to attain the foregoing object, according to a first aspect of the invention, a pattern exposure method for moving a plurality of outgoing beams emitted from light sources relatively to a work so as to expose the work to the outgoing beams to thereby draw a pattern on the work, wherein a desired to-be-exposed place is exposed by the outgoing beams different from each other a plurality of times.

According to a second aspect of the invention, a pattern exposure apparatus for moving a plurality of outgoing beams emitted from light sources relatively to a work so as to expose the work to the outgoing beams to thereby draw a pattern on the work, wherein the light sources are arrayed in biaxial directions perpendicular to each other, and a polygon mirror is provided, while one of the directions in which the light sources are arrayed is aligned with a scanning direction of the polygon mirror.

In addition, according to a third aspect of the invention, there is provided a pattern exposure apparatus comprising: a plurality of semiconductor lasers; collimator lenses for collimating a plurality of outgoing beams emitted from the plurality of semiconductor lasers respectively; a multi-beam parallelizing optical unit for parallelizing a plurality of collimated beams emerging from the collimator lenses; a multi-beam spot forming optical system for reducing the plurality of collimated beams parallel to one another, in two directions perpendicular to the optical paths of the beams; a stage on which a substrate is mounted, on which multi-spots formed by the multi-beamspot forming optical system are exposed; a scanning unit for performing a relative scan between the multi-spots and the stage; and a control circuit for turning on/off the plurality of semiconductor lasers in accordance with a desired pattern to be drawn by exposure, a layout of the semiconductor lasers and a velocity of the relative scan.

Since a desired to-be-exposed place is exposed to outgoing beams emitted from light sources different from each other a plurality of times, low-power light sources can be used as the light sources.

In addition, the through put can be increased by increasing the number of light sources.

BRIEF DESCRIPTION OF THE DRAWINGS

FIGS. 23A-23D are views for explaining the function of an exposure apparatus according to the present invention.

DESCRIPTION OF THE PREFERRED EMBODIMENTS

Detailed description will be given below.

First Embodiment

A first embodiment of the invention will be described below.

Figure 1A:
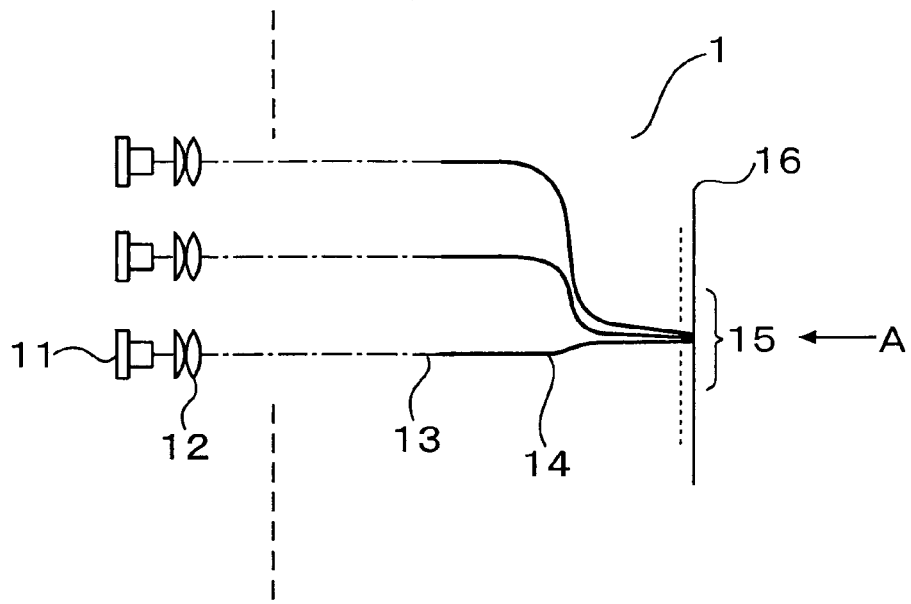
FIGS. 1A-1B are configuration views of a secondary light source forming optical system according to the present invention.
Figure 1B:
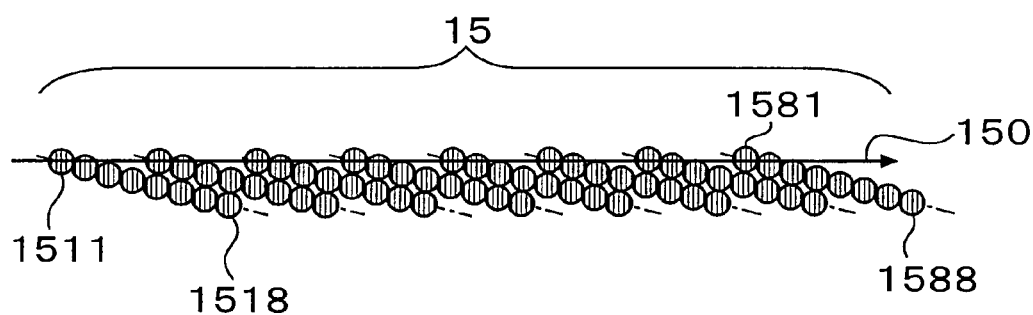

FIGS. 1A and 1B are configuration views of an optical system forming a secondary light source according to the invention. FIG. 1A is a plan view and FIG. 1B is a view on arrow A in FIG. 1A.

A light source system 1 is constituted by a plurality of semiconductor lasers 11 arrayed in two directions, lenses 12 and fibers 14. Each semiconductor laser 11 emits a laser beam 1a with a wavelength of 405 nm and an output power of 60 mW. Since the emitted laser beam 1a is a divergent beam, the laser beam 1a is converged by the corresponding lens 12 with a short focal length, and incident on an input face 13 of the corresponding fiber 14 perpendicular thereto with high directivity such that the maximum incident angle thereof is not larger than several degrees. In such a manner, the laser beams 1a enter into the fibers 14 not less than 90%. Incidentally, the lenses 12 and the fibers 14 are provided correspondingly to the semiconductor lasers 11 respectively.

Figure 2:
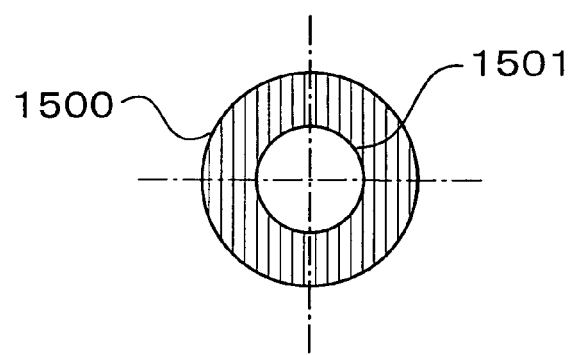
FIG. 2 is a sectional view of a fiber.

Output faces 15 of the fibers 14 are disposed on a plane 16. As shown in FIG. 1B, in this embodiment, 64 output faces 15 (that is, secondary light sources) are disposed on the plane 16 so that output faces 1511, 1521, ... and 1581 are aligned in a scanning direction 150 (y-direction) while output faces 1511, 1512, ... and 1518 are aligned in a direction crossing the scanning direction 150. Each fiber 14 comprises a core portion 1501 and a clad portion 1500 disposed around the core portion 1501 as shown in FIG. 2. In this embodiment,the diameter of the core portion 1501 is 50 μm, and the diameter of the clad portion 1500 is 100 μm. Incidentally, the output faces 15 of the fibers 14 serve as secondary light sources.

Figure 3:
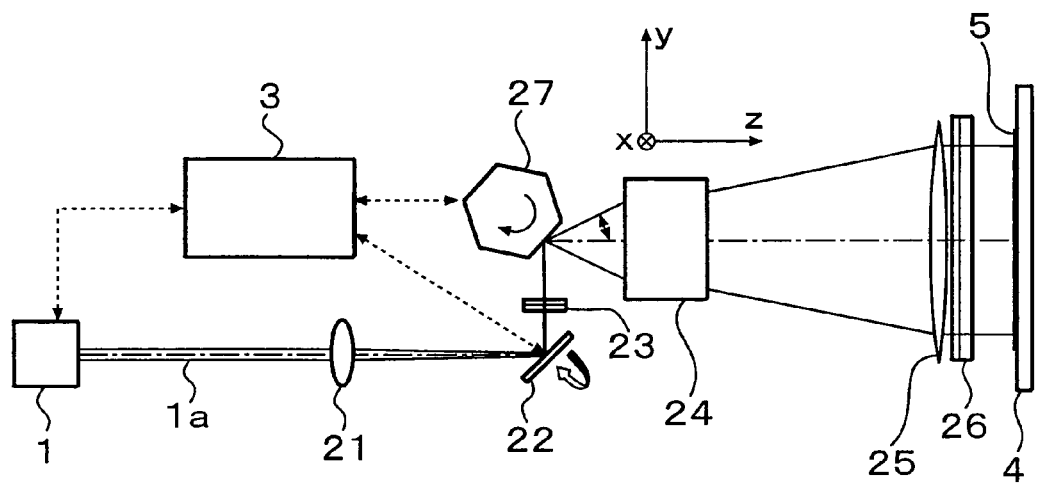
FIG. 3 is a view for explaining the function of an exposure apparatus according to the present invention.

FIG. 3 is a view for explaining the function of an exposure apparatus according to the invention. A condenser lens 21 is disposed in a position at a distance corresponding to a focal length f of the condenser lens 21 from the surface of a polygon mirror 27.

Main rays of the laser beams 1a emerging from the output faces 15 are parallel to one another, and the directivities thereof are substantially equal to the directivities of incident beams on the corresponding fibers 14 respectively, or become slightly worse. The 64 high-directivity laser beams 1a emerging from the output faces 15 are reflected by a piezo-deflection mirror 22 after traveling through the condenser lens 21, and incident on the polygon mirror 27 after traveling through a cylindrical lens 23. That is, the laser beams 1a emerging from the output faces 15 with high directivities but as divergent beams are formed into substantially collimated beams by the lens 21, and narrowed down in the x-direction of FIG. 3 by the cylindrical lens 23. The laser beams 1a are incident on the polygon mirror 27 so that the laser beams 1a in the scanning direction are arranged in the y-direction (that is, those from the output faces 1511, ... and 1581 are aligned as a first array, and those from the output faces 1512, ... and 1582 are aligned as a second array). Incidentally, the width in the x-direction on the polygon mirror is minimal.

Two lenses 24 and 25 have a function as an fθ lens. By this fθ lens and the cylindrical lens 26, images in the x-direction on the polygon mirror 27 are imaged on the substrate with an imaging magnification factor M. Thus, spots each having a diameter of about 30 μm are formed in the x-direction on the substrate. The y-direction lens powers of the cylindrical lenses 23 and 26 are zero. Therefore, as for the y-direction, the collimated beams are incident on the fθ lens, and condensed as spots each having a diameter of 30 μm in the y-direction by the operation of the fθ lens. Due to this configuration, even when there is an inclination among the respective reflective facets of the polygon mirror, there is no fear that the inclination causes a pitch misalignment in the scanning beams. In such a manner, images of the secondary light sources shown in FIG. 1B are formed on the substrate.

The piezo-deflection mirror 22 serves to correct image distortions of the fθ lens. That is, spots scanning the substrate through the fθ lens with the rotation of the polygon mirror 27 may not move on a straight line on the exposure surface but be misaligned. However, the misalignment is reproduced in every scan. Therefore, the image distortions are measured in advance, and corrected by the piezo-deflection mirror 22.

The control circuit 3 drives the piezo-deflection mirror 22 while controlling to turn ON/OFF the 64 semiconductor lasers 11 in accordance with an exposure pattern and a signal from a rotary encoder (not shown) monitoring the rotation of the polygon mirror 27. Thus, x-direction correction of patterning is performed in accordance with the image distortion of the fθ lens. In addition, the stage 4 on which the substrate 5 is mounted is driven in the x-direction at a constant speed. Incidentally, the method for driving the piezo-deflection mirror 22 will be described later.

Figure 4:
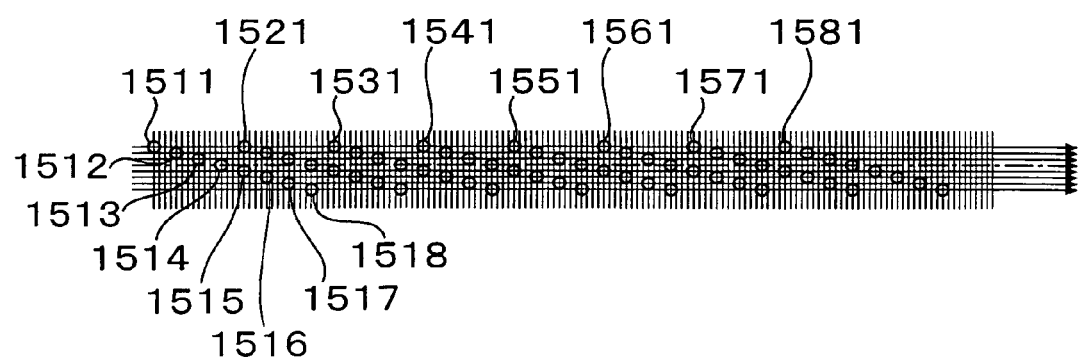
FIG. 4 is a view showing images of secondary light sources on a substrate according to the present invention.

FIG. 4 is a view showing images (spot images) of the secondary light sources on the substrate. Each arrow line shown on the right side designates the direction of a scan with the polygon mirror. Incidentally, each grid point designates the center of each pixel of patterning.

In FIG. 4, the reference numerals 1511, 1521, 1531, ... and 1581 represent spots aligned in the scanning direction of the polygon mirror, while the reference numerals 1511, 1512, 1513, ... and 1518 represent a spot array in another direction than the scanning direction. In the illustrated case, the spots aligned in the scanning direction are arrayed at a pitch 16P which is 16 times as high as a pixel pitch P (resolution). The array pitch of the spots in a direction perpendicular to the scanning direction is equal to the pixel pitch P.

In such a manner, whenever the polygon mirror 27 is rotated by one facet (a 1/N rotation, when the polygon mirror is an N-faced polyhedron), pixels located immediately under the spot 1518 shown in FIG. 4 will be scanned with the spots 1511, 1521, . . . , 1581 or the like in the next scan. That is, 8 pixels in a direction perpendicular to the scanning direction are patterned and exposed in one scan.

Attention is called to one pixel in the scanning direction. Eight spots are aligned in the scanning direction. Accordingly, as for any point (pixel) in the course of a scan, the eight spots pass through the point during the scan, and the point is exposed to the eight spots. For example, even when there is a variation of about $\sigma$ in intensity among the spots, statistically the variation of an integrated light exposure as a result of exposure to the eight spots can be reduced to about $\sigma/2\sqrt{2}=0.35\sigma$.

Although the diameter of each spot image in FIG. 4 is twice as large as the pixel pitch P, the beam diameter may be made approximately not smaller than P and not larger than 4P.

Figure 5:
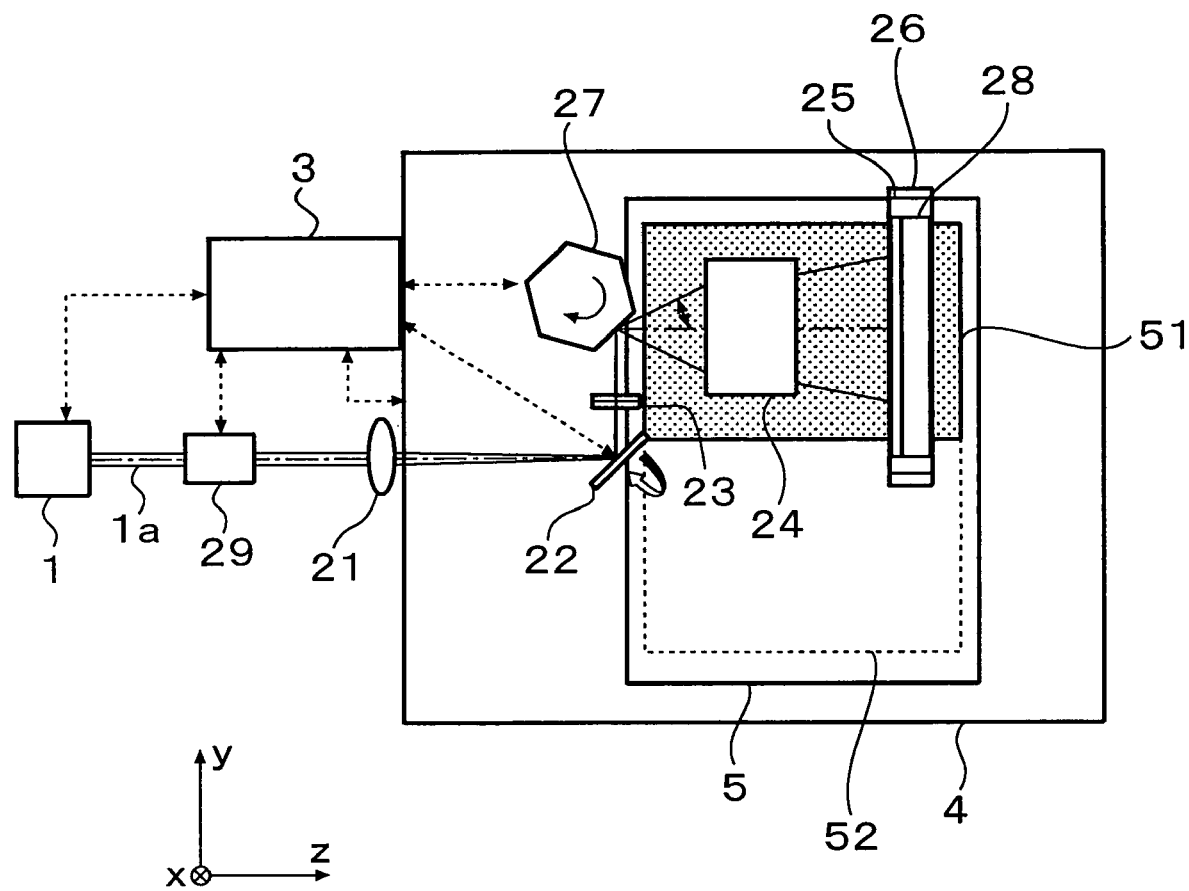
FIG. 5 is a plan view showing the configuration of the exposure apparatus according to the present invention.

FIG. 5 is a plan view showing the configuration of an exposure apparatus according to the invention. Parts the same as or functionally the same as those in FIG. 3 are denoted by the same reference numerals correspondingly, and description thereof will be omitted. As shown in FIG. 5, in order to dispose a substrate 5 and an optical system horizontally, the optical paths of laser beams 1$a$ are bent at an angle of 90 degrees between an fθ lens and the substrate 5 by a mirror 28. Thus, the substrate 5 disposed horizontally is exposed to the laser beams 1$a$ having vertical optical paths.

The substrate 5 mounted on a stage 4 may be large. In such a case, as soon as exposure of a region 51 of the substrate 5 being exposed currently is finished, the stage 4 is moved stepwise in a y-direction in FIG. 5. Thus, a region 52 is subsequently exposed. The z-direction scan with the optical system and the y-direction stepwise movement of the stage 4 are achieved by a not-shown drive mechanism and a not-shown length measuring machine attached to the stage 4. Thus, the position of the stage 4 is controlled accurately by a control circuit 3.

A shutter 29 is provided for turning ON/OFF optical paths of the laser beams as a whole (that is, 64 laser beams 1$a$ emitted from 64 semiconductor lasers 11). The shutter 29 is constituted with an EO modulator, an AO modulator, or a mechanical shutter to be driven in ms order. The shutter 29 will be described later.

Next, with reference to FIGS. 5 and 6A-6E, description will be made about the exposure method and the operation of the exposure apparatus according to the invention.

The semiconductor lasers 11 are driven and turned ON/OFF based on information about patterning. Generally the emission intensity of each semiconductor laser changes in accordance with its own temperature. Accordingly, the emission intensity when patterning is initiated suddenly when the semiconductor laser has been turned OFF till the patterning differs from the emission intensity when some time has passed since the start of the patterning.

To solve this problem, the shutter 29 is used.

That is, the semiconductor lasers 11 are turned ON and OFF at an average ON/OFF ratio during patterning from some time before the patterning is initiated. The work to be exposed may be irradiated with the light at this time. Therefore, the shutter 29 is set in an OFF state, that is, a light blocking state at any time other than during patterning. In such a manner, the semiconductor lasers 11 reach a desired stable temperature state at the timing of actual patterning. Thus, stable exposure intensity can be obtained.

Figure 6A:
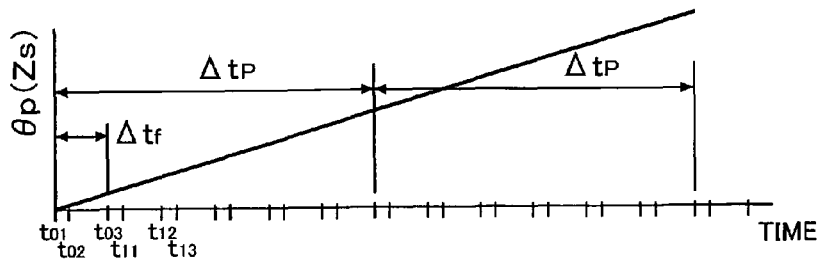
FIGS. 6A-6E are charts for explaining the operation of the present invention.

It is essential that the polygon mirror 27 rotates at a constant rotational speed till exposure can be initiated. A not-shown motor is rotated by a not-shown drive circuit, and the rotation state is monitored with a not-shown rotary encoder by the control circuit 3. When the rotational speed of the polygon mirror 27 reaches a fixed value within a predetermined range, exposure is initiated. FIG. 6A shows a rotation angle θP of the polygon mirror 27. Since the rotational speed is constant, the slope is a straight line indicating the rotational speed. In addition, synchronously with this rotational speed, the stage 4 is moved in the z-direction at a constant speed by a not-shown motor in accordance with an instruction from the control circuit 3. The Z-coordinate of the position of the stage 4 draws a straight line as shown by (Zs) in FIG. 6A.

Figure 6B:
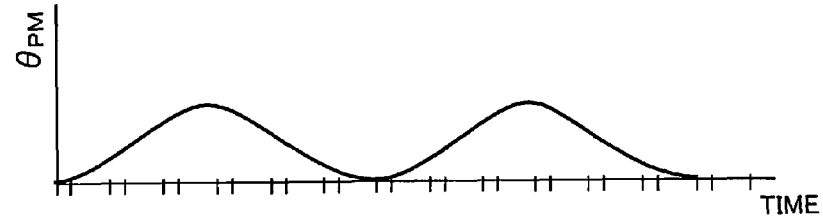

ΔtF and ΔtP shown in FIG. 6A designate a period of one-facet rotation of the polygon mirror and a period of one rotation of the same respectively. With the rotation of the polygon mirror 27, a scan in the y-direction in FIG. 5 is performed with a plurality of spots based on a plurality of semiconductor lasers 11. This scan is ideally linear as described previously. In fact, due to the assembling accuracy of the fθ lens or the like, the scan is not always linear. However, such a nonlinearity is always reproduced stably in every scan repeated in the period ΔtF. Therefore, the nonlinearity is measured in advance, and the measured value is stored in the control circuit. The piezo-deflection mirror 22 is driven using a compensation value determined on the basis of the measured value as shown in FIG. 6B. In such a manner, scanning is performed substantially linearly even when the fθ lens has image distortion.

On the other hand, even if the polygon mirror rotates constantly, the y-direction speed of the scanning beams will not be constant when the fθ lens has image distortion. This y-direction image distortion can be also measured in advance. It is therefore possible to eliminate the y-direction image distortion if the ON/OFF timing of the semiconductor lasers is controlled by the control circuit 3 in consideration of the distortion. Further in detail, the rotational speed of the polygon mirror 27 is not always constant. Accordingly, when a pulse signal of the rotary encoder directly coupled with the polygon mirror 27 is read and the semiconductor lasers 11 are turned ON/OFF in accordance with the pulse signal, patterning can be achieved with little distortion.

Figure 6C:

FIG. 6C shows the time when the shutter 29 is in an ON state, that is, the shutter 29 is blocking light. As described previously, the shutter 29 is in the light blocking state till exposure can be initiated. In addition, the shutter 29 is brought into the light blocking state between the time when a scan is terminated and the time when the next scan is initiated. Preferably the semiconductor lasers are turned ON/OFF on fixed duty also in the light blocking state between the scans.

Figure 6D:
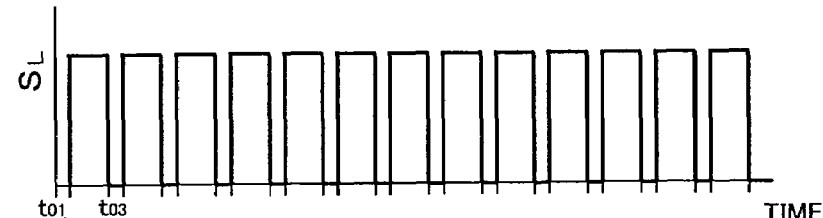
Figure 6E:
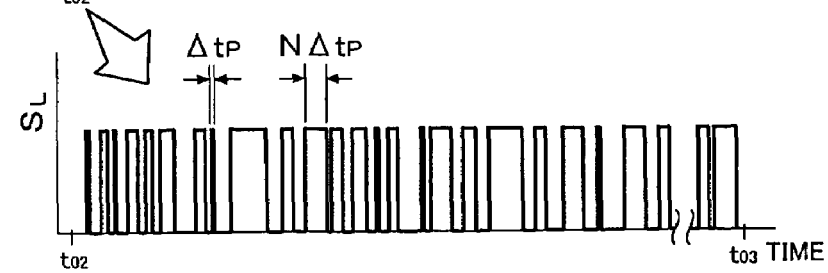

FIG. 6D shows the ON/OFF timing of the semiconductor lasers 11 during scans based on patterning information. That is, as described above, the state of 0 in this graph does not indicate the semiconductor lasers 11 are in the OFF state. FIG. 6E shows the details in one scan (that is, between a time t02 and a time t03) in FIG. 6D. That is, the semiconductor lasers 11 are turned ON/OFF at a high speed based on the patterning information, as shown by a signal SL. When the time required to pass one pixel is ΔtP, the pulse width of the ON/OFF signal SL is expressed by NΔtP where N is an integer. Not to say, such pulse driving is performed on all the semiconductor lasers 11 based on the patterning information.

Second Embodiment

Description will be made below about a second embodiment of the present invention.

Figure 7:
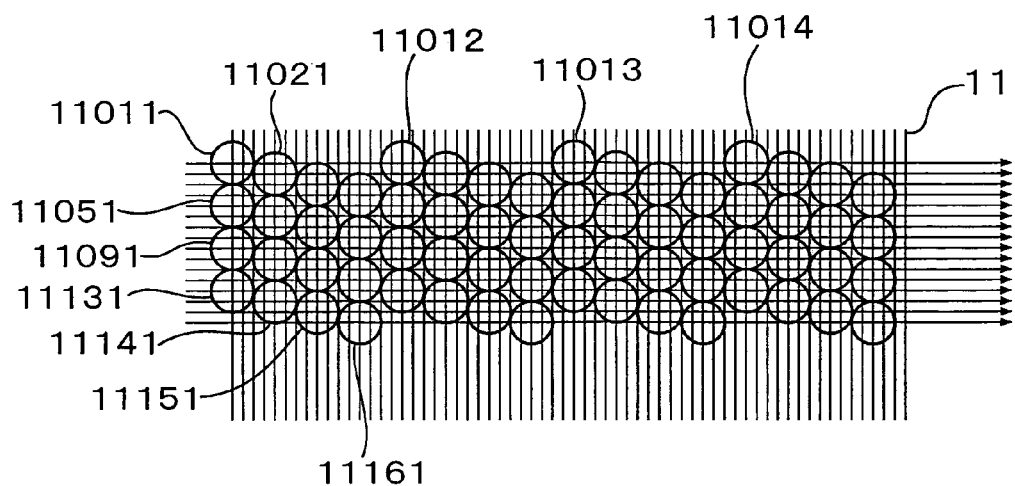
FIG. 7 is a view showing another embodiment of the present invention.

FIG. 7 is a view showing the second embodiment of the invention. The grid in FIG. 7 shows a pixel pitch with which patterning will be performed finally by projecting laser beams on a work to be exposed.

Semiconductor lasers 11011, 11012, 11013 and 11014 are aligned in a direction corresponding to a scanning direction y in FIG. 7. On the other hand, semiconductor lasers 11011, 11051, 11091 and 11131 are aligned in a movable direction z of the stage 4 in FIG. 5.

Figure 8:
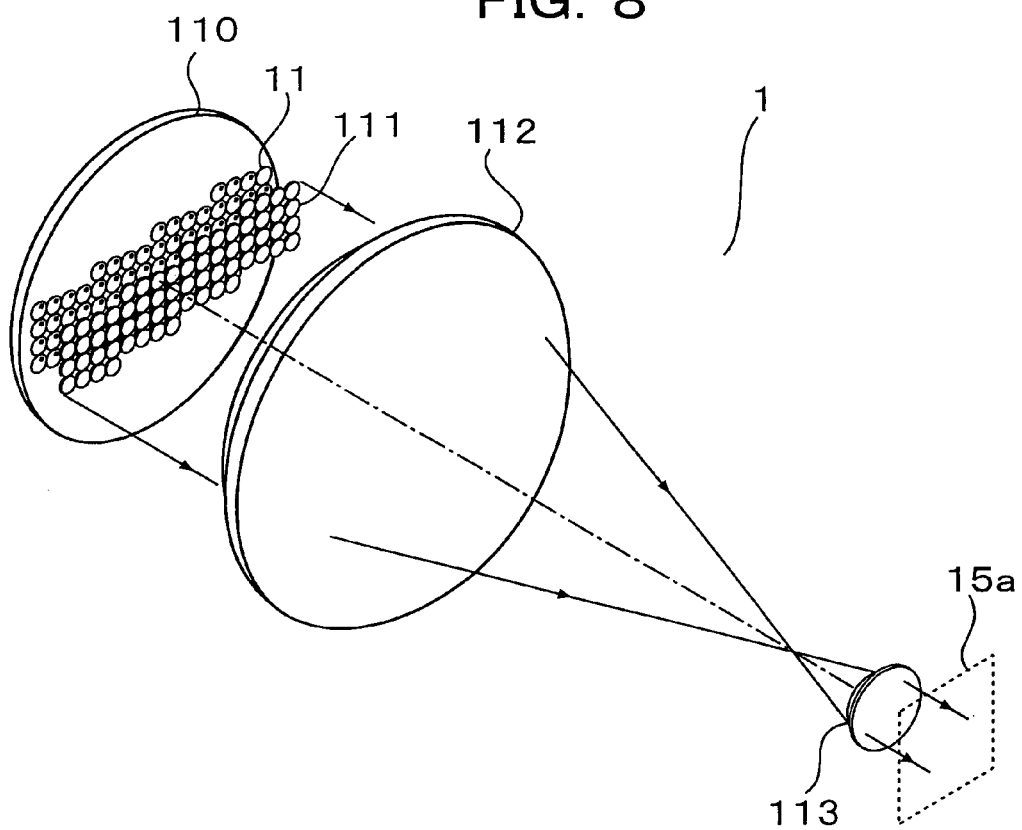
FIG. 8 is a perspective view of FIG. 7.

FIG. 8 is a perspective view of FIG. 7. As shown in FIG. 8, the semiconductor lasers 11 are arrayed on a semiconductor laser holder substrate 110. Laser beams 1a emitted from the semiconductor lasers 11 respectively are formed into substantially collimated laser beams 1a respectively by a plurality of collimator lenses 111 arrayed in the same array condition as the semiconductor lasers 11. That is, the main rays of the laser beams 1a emitted from the semiconductor lasers 11 and passing through the corresponding collimator lenses 111 respectively are substantially parallel to one another and hardly spread. The distance between adjacent ones of the main rays is slightly larger than the diameter of the package of each semiconductor laser 11.

The 64 parallel and telecentric laser beams 1a pass through a condenser lens 112 and are condensed substantially into one point near the focal position of the condenser lens 112. Since this beam-condensing point is located in an anterior focal point of a lens 113, 64 spot images are obtained as secondary light sources on a plane 15a (corresponding to the output faces 15 in FIGS. 1A and 1B) after the laser beams 1a pass through the lens 113. When the secondary light sources are used in the same manner as the secondary light sources obtained using the fibers 14 shown in FIG. 1A or FIG. 5, a work to be exposed can be patterned and exposed in the same manner as when the fibers 14 are used.

Incidentally, the main rays of the laser beams 1a which have passed through the lens 113 do not have to be always parallel in FIG. 8. For some characteristic of the fθ lens, it may be desired that the main rays are convergent or divergent. In addition, as for the parallelism of the beams, it maybe desired that the beams are not parallel.

Third Embodiment

Description will be made below about a third embodiment of the invention.

Figure 9:
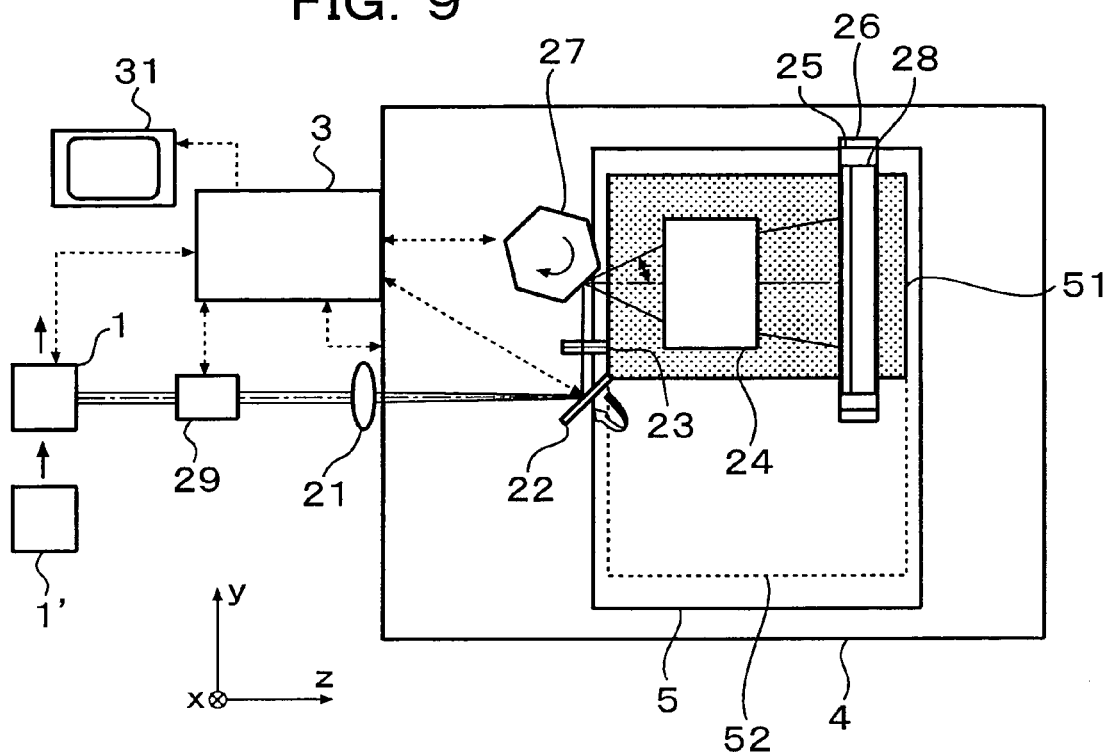
FIG. 9 is a view showing further another embodiment of the present invention.

FIG. 9 is a diagram of the third embodiment of the invention. Parts the same as or functionally the same as those in FIG. 5 are denoted by the same reference numerals correspondingly, and description thereof will be omitted.

Figure 10A:
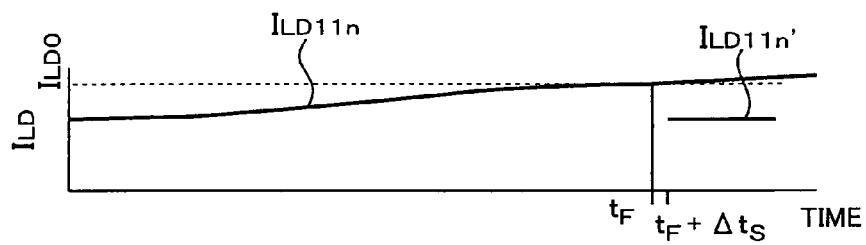
FIGS. 10A-10C are charts for explaining the operation of the present invention.

Assume that several tens or several hundreds of semiconductor lasers 11 are used. In such a case, when only one of the semiconductor lasers 11 expires and has no output, a variation in light exposure occurs so that exposure cannot be performed with a correct pattern. Therefore, detection signal strength is imported from a not-shown laser beam intensity detection device included in each semiconductor laser 11 or a not-shown laser intensity detection device provided externally for each semiconductor laser 11 and for detecting the intensity of the semiconductor laser 11 individually. The detection signal is obtained for each semiconductor laser 11 individually, and a driving current for the semiconductor laser is controlled individually based on the obtained signal. Thus, the laser output from any semiconductor laser 11 is set at one and the same fixed value. In such a manner, when the operating time reaches several thousands of hours, the driving current value ILD of each laser increases and reaches a fixed threshold value ILD0 as shown in FIG. 10A. At a time tF when the driving current value ILD reaches the threshold value, a display for notifying that the lives of the semiconductor lasers 11 expire is made on a monitor 31 shown in FIG. 9.

Further, a backup integrated unit 1' having quite the same structure as the integrated unit 1 in which the plurality of semiconductor lasers 11 and the secondary light source forming unit have been integrated is provided additionally. At suitable timing having no interference with exposure after the time tF when the lives of the semiconductor lasers 11 expire, the integrated unit 1 is automatically replaced by the new integrated unit 1'. For example, the replacement is performed as soon as substrate exposure being operated currently is finished, or as soon as exposure of one lot of substrates is finished when exposure is performed on several tens of substrates as one lot, or as soon as daily exposure is terminated. In such a manner, operation can be continued without interference with the exposure process. Incidentally, Δts in FIGS. 10A to 10C designates the duration of replacement.

Figure 10B:
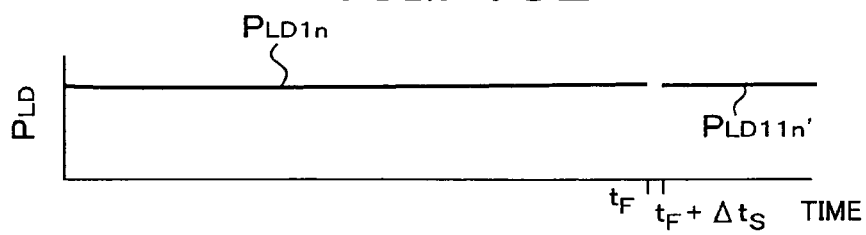
Figure 10C:
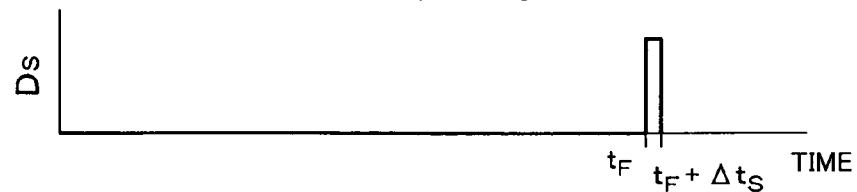

As described above, the intensity of each individual semiconductor laser can be detected by the laser beam intensity detection device included in the semiconductor laser 11 or the laser intensity detection device provided externally for each semiconductor laser and for detecting the intensity of the semiconductor laser individually. Accordingly, as shown in FIG. 10B, a semiconductor laser driving current ILD11$n$ is controlled so that intensity PLD11$n$ of a 11$n$-th semiconductor laser becomes constant. Thus, the intensity of each laser is always made constant.

When the semiconductor laser driving current ILD11$n$ is changed in the aforementioned method as shown in FIG. 10A in order to keep the output power of the 11$n$-th semiconductor laser constant, the semiconductor laser driving current ILD11$n$ reaches a threshold value ILD11$n$ where the semiconductor laser will be almost dead if the current value is further increased. The threshold value differs from one semiconductor laser 11 to another. However, when the relationship between the driving current and the output power is known in advance, the threshold values of the semiconductor lasers 11 can be estimated individually. Thus, the estimated threshold values are stored in the control circuit 3 in advance. Assume that, of the 64 semiconductor lasers 11, the n-th semiconductor laser 11 reaches its threshold current at the time tF prior to the other semiconductor lasers. In this event, at timing suitable for replacement, as described above, the integrated unit 1 is replaced by the new integrated unit 1'. This replacement can be achieved without any adjustment only if the accuracy in positional repeatability of the integrated unit is high. Thus, the replacement can be completed after the exposure of the aforementioned substrate is terminated and before the exposure of the next substrate is initiated.

As described previously, the output power of each semiconductor laser depends strongly on its own temperature. In order to make the laser intensities constant individually during actual exposure, it is therefore preferable that the shutter 29 is brought into the light blocking state in a period of time clear of exposure timing, while each semiconductor laser 11 is driven and turned ON, and a driving current or the like is electrically controlled to make the intensity of the semiconductor laser 11 constant. Thus, exposure can be carried out with more stable quality.

Although the number of the semiconductor lasers is set at 64 in this embodiment, the invention is not limited to this number. When the semiconductor lasers 11 have greater output power individually, the number of the semiconductor lasers 11 can be reduced. Further, when a large number of semiconductor lasers 11 having greater output power are used, it is possible to obtain a high-throughput exposure apparatus. In such a manner, according to the invention, the number of semiconductor lasers 11 can be selected in accordance with the desired performance of the exposure apparatus, and the apparatus fitted to its purpose can be obtained easily.

Next, description will be made about the intensity of each laser beam 1a when a fiber 14 is used.

Figure 11:
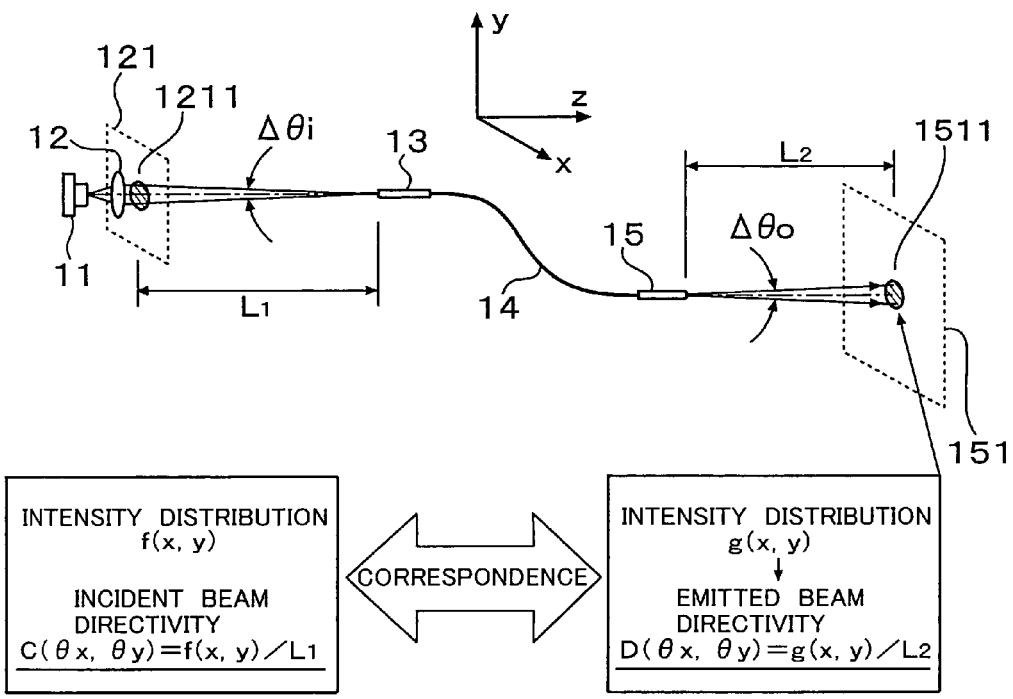
FIG. 11 is a view for explaining the operation of the present invention.

FIG. 11 is a diagram showing the directivity of the laser beam 1a incident on the fiber 14 and the directivity of its outgoing beam.

The directivity of the laser beam 1a is obtained as follows.

That is, a screen 121 is disposed behind the lens 12. A spread f(x, y) is examined from an image 1211 of the laser beam 1a passing through the lens 12 disposed just behind the semiconductor laser 11 and having a short focal length. Directivity C(θx, θy) of the laser beam 1a incident on the fiber 14 is obtained from the spread f(x, y) using a distance L1 between the screen 121 and the input face 13.

In the same manner, a screen 151 is disposed behind the output face 15a. A spread g(x, y) is examined from an image 1511 on the screen 151 placed in a position at a distance L2 from the fiber output face. Directivity D(θx, θy) of the laser beam 1a emerging from the output face 15 is obtained from the spread g(x, y).

Due to a variation in x- and y-direction emission directivities among the semiconductor lasers 11, the distribution of each laser beam 1a incident on the fiber 14 does not have rotational symmetries. However, the directivity of the laser beam 1a emerging from the fiber 14 has rotational symmetries substantially.

Here, assume that angular coordinates (θx, θy) are converted into angular coordinates (θ, φ) consisting of an angle θ with respect to the central axis of the fiber 14 and an angle φ around the central axis (that is, θx=sinθcosφ, and θy=sinθsinφ), and C(θx, φy) and D(θx, φy) are expressed by C'(θ, φ) and D'(θ, φ) using the angles θ and φ. Then, when the loss inside the fiber 14 is negligible, the following expression is substantially established.

$$\int D'(\theta, \phi)d\phi = \int C'(\theta, \phi)d\phi$$

Figure 12:
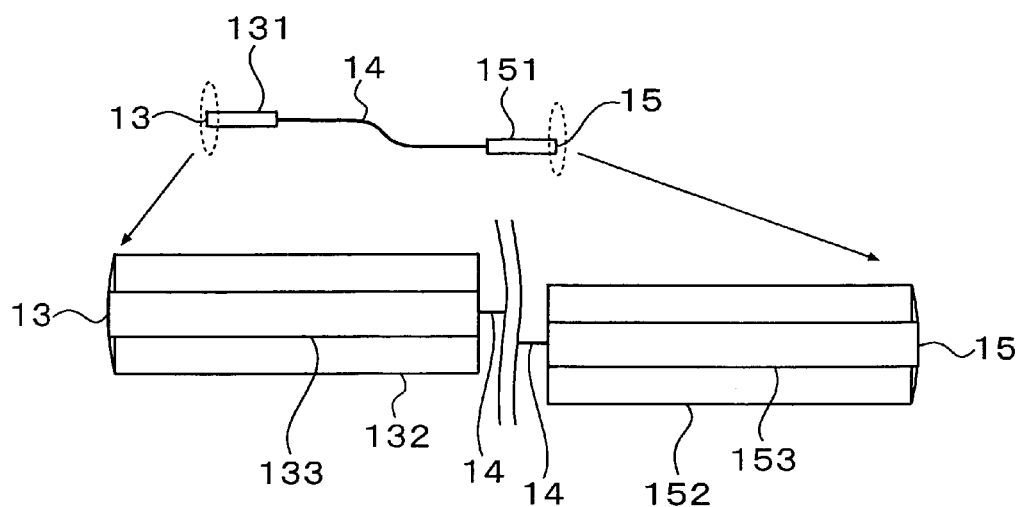
FIG. 12 is a view for explaining the connection of a fiber.

However, as shown in FIG. 12, when the input face 13 and the output face 15 are not flat but close to spherical surfaces, a lens effect occurs so that the aforementioned expression is not established. Thus, the left-hand side, that is, the directivity of the laser beam 1a deteriorates so that the laser beam 1a spreads. When the laser beam 1a spreads, the laser beam 1a cannot be narrowed into a desired spot diameter on the substrate 5.

Although the terminal faces of the fiber 14 are processed to be flat, the diameter of the core of the fiber 14 is about several ten microns and hundred microns, which is so small that it is very difficult to process the terminal faces to be flat. Therefore, when the fiber 14 is used as it is, the directivity of the laser beam 1a deteriorates so that a required spot diameter cannot be obtained.

Figure 13:
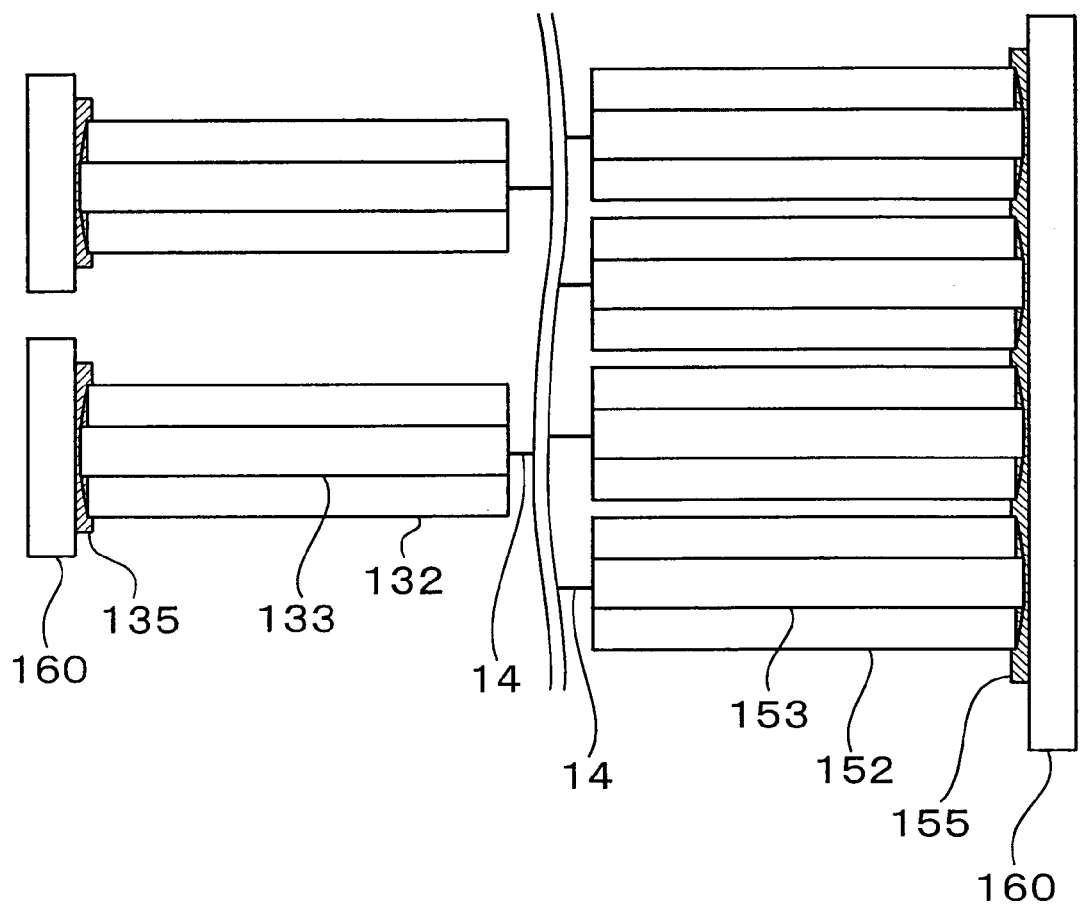
FIG. 13 is a view for explaining glasses for connecting fibers thereto.

FIG. 13 is a view of an embodiment that can solve the problem. That is, glasses 160 processed to be flat in advance are disposed closely to the input faces 13 and the output faces 15 of the fibers 14, and optical adhesive 155 is applied into a gap between each fiber 14 and each glass 160. When the refractive indexes of the fibers 14, the glasses 160 and the optical adhesive 155 are made substantially identical to one another, the laser beams 1a will turn out to be substantially incident on flat terminal faces even if the terminal faces of the fibers 14 have bad flatness. Thus, there is no fear that the directivities of the laser beams 1a deteriorate.

Assume that the two surfaces of each glass 160 are perfectly parallel to each other. In this case, when the laser incident axis is set to be parallel to the axis of the fiber 14, light is reflected perpendicularly by the input face 13 and the output face 15 on the glass 160. Thus, back-reflected light incident on the semiconductor laser 11 makes the oscillation of the semiconductor laser 11 unstable. As a result, the intensity of exposure becomes so unstable that patterning cannot be carried out with high accuracy. Therefore, a slight angle is provided between the two surfaces of each glass 160 so that the laser beam 1a can be made incident on the receiving surface of the glass 160 non-perpendicular thereto and to emerge from the exit surface of the glass 160 non-perpendicular thereto, while the main ray of the laser beam 1a becomes parallel to the optical axis of the fiber 14. Thus, there is no problem about back-reflection to the semiconductor laser 11, while the laser beam 1a can be made incident on the fiber 14 in the best condition (that is, the condition that the optical axis of the fiber 14 is parallel to the main ray of the laser beam 1a just before the laser beam 1a is incident on the fiber 14).

Fourth Embodiment

Description will be made below about the fourth embodiment of the invention.

Figure 14A:
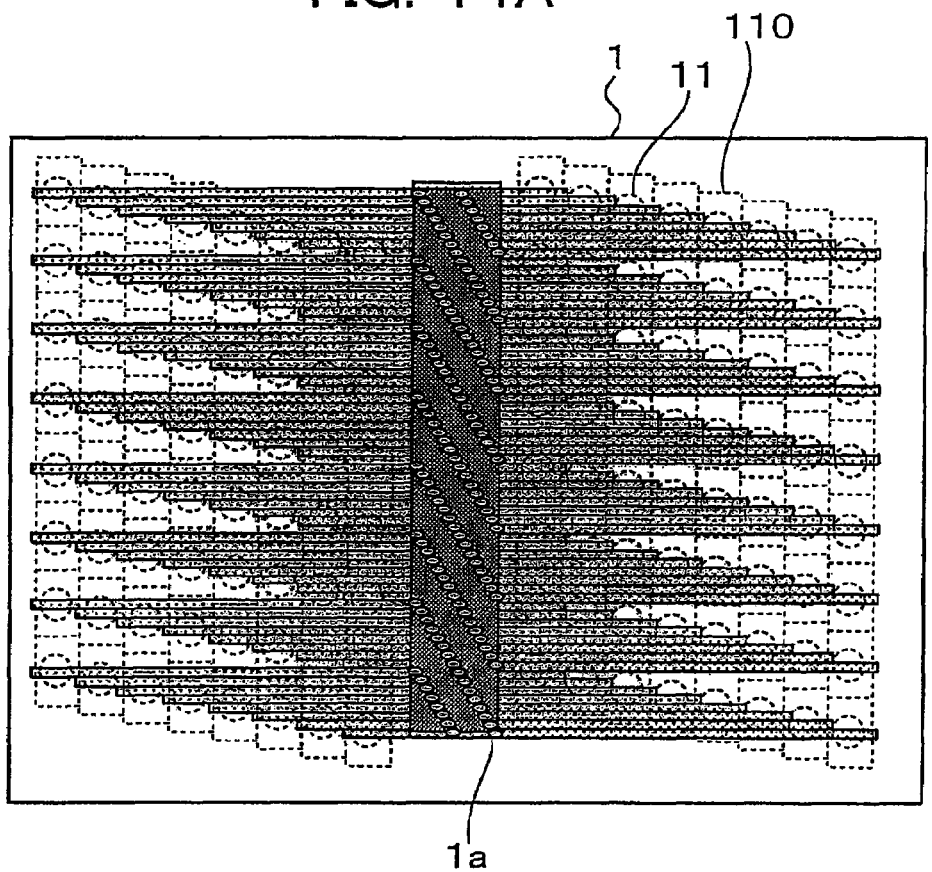
FIGS. 14A-14B are configuration views of a secondary light source forming optical system showing an embodiment of the present invention.
Figure 14B:
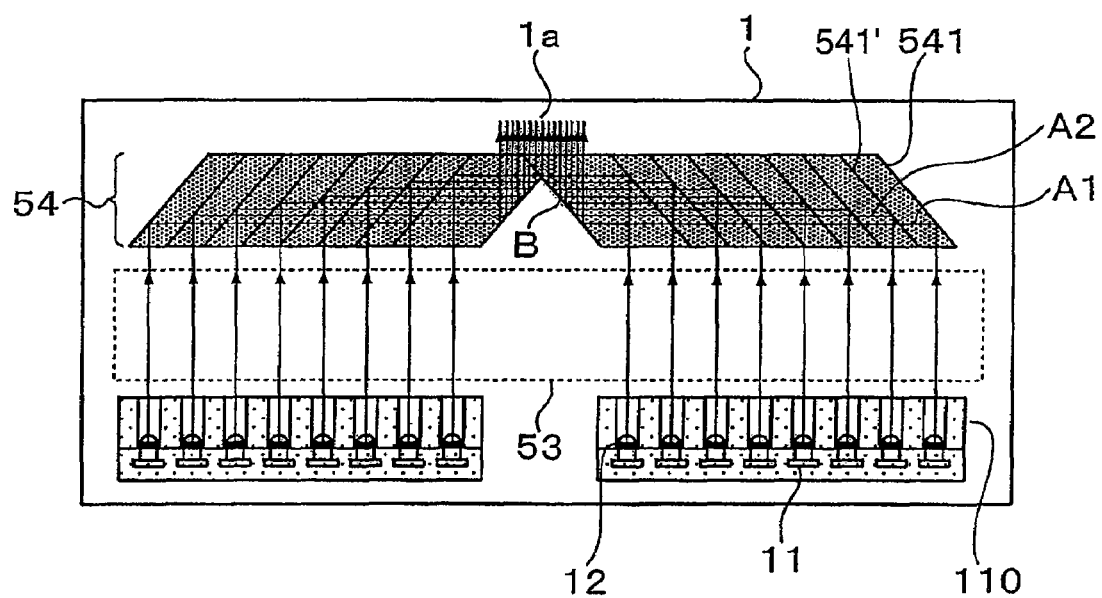

FIGS. 14A and 14B are configuration views of a secondary light source forming optical system showing the fourth embodiment of the invention. FIG. 14A is a view observed along the traveling direction of laser beams 1a. FIG. 14B is a view observed along the direction in which the traveling direction of the laser beams 1a is parallel to the paper. Incidentally, parts the same as or functionally the same as those in FIGS. 1A and 1B are denoted by the same reference numerals correspondingly, and redundant description thereof will be omitted.

A not-shown water-cooled pipe is provided in a semiconductor laser holder substrate 110 holding semiconductor lasers 11 so as to cool the semiconductor laser holder substrate 110. Each laser beam 1a whose x-direction angle of divergence is about 22 degrees in full width at half maximum and whose y-direction angle of divergence is about 8 degrees in full width at half maximum is converged into a collimated beam by a lens 12. The collimated beam is incident perpendicular on a beam-diameter-unchanging beam-pitch-reducing unit 54 through a beam direction fine control unit 53 which will be described later.

In the beam-diameter-unchanging beam-pitch-reducing unit 54, a plurality of prisms 541 which are parallelograms in section are placed on one another symmetrically with respect to the center of the semiconductor laser holder substrate 110. Incidentally, the central portion of the beam-diameter-unchanging beam-pitch-reducing unit 54 is formed in a so-called nested structure (a shape in which the prisms 541 formed like comb teeth are combined with one another) such that the laser beams 1*a* pass only the interiors of the prisms 541.

Attention is now directed to the rightmost laser beam 1*a* in FIG. 14B. Due to the aforementioned configuration, the laser beam 1*a* reflected by a surface A1 of a prism 541 turns left. Then, the laser beam 1*a* reflected by a left end surface B of the prism 541 turns upward. The second laser beam 1*a* from the right reflected by a second prism 541' from the right turns left. Then, the laser beam 1*a* reflected by a left end surface B of the prism 541' turns upward.

Description will be made more in detail.

Figure 15A:
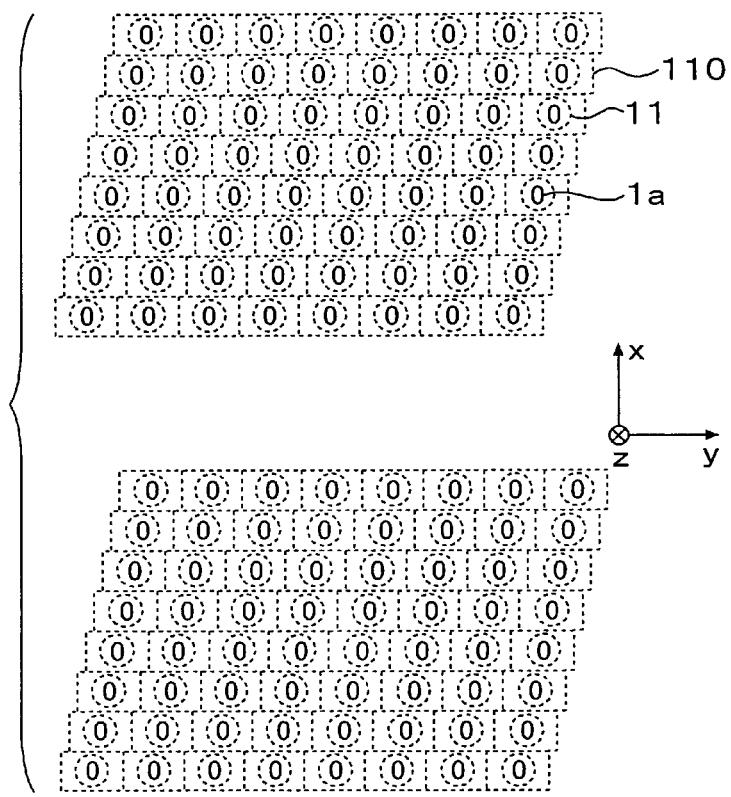
FIGS. 15A-15C are views for explaining the layout of semiconductor lasers and the positional relationship among laser beams.
Figure 15B:
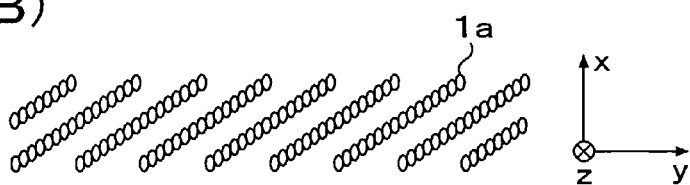
Figure 15C:
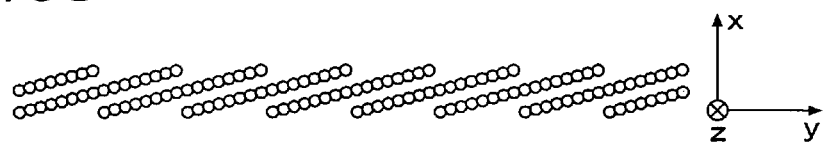

FIGS. 15A-15C are views for explaining the layout of the semiconductor lasers 11 and the positional relationship of the laser beams 1*a*.

As shown in FIG. 15A, the semiconductor lasers 11 are arranged on the semiconductor laser holder substrate 110 with a pitch of 12 mm both in the x-direction and in the y-direction. Accordingly, the laser beams 1*a* collimated by the lenses 12 are incident on the beam-diameter-unchanging beam-pitch-reducing unit 54 in the state where the laser beams 1*a* are arranged with a pitch of 12 mm both in the x-direction and in the y-direction. Each of the laser beams 1*a* collimated by the lenses 12 has an elliptic intensity distribution measuring about 4 mm in the x-direction diameter and about 1.5 mm in the y-direction diameter. As shown in FIG. 15B, when the laser beams 1*a* pass through the beam-diameter-unchanging beam-pitch-reducing unit 54, the laser beams 1*a* are arranged with a pitch of 1 mm in the x-direction without any change in their beam shapes. That is, though the interval between adjacent ones of the semiconductor lasers 11 is 12 mm, the interval between adjacent ones of the laser beams 1*a* which have passed through the beam-diameter-unchanging beam-pitch-reducing unit 54 is 1 mm.

Figure 16:
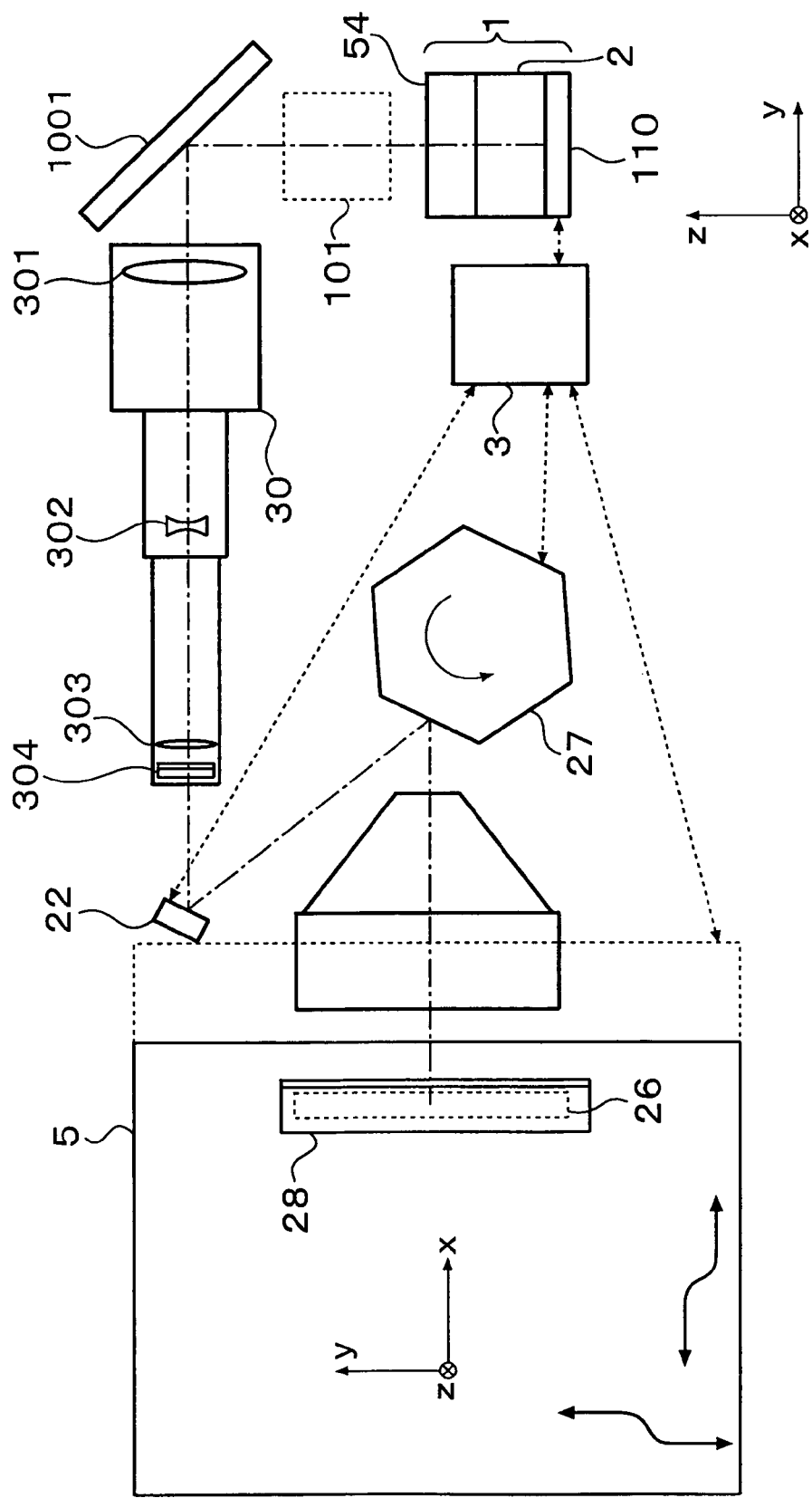
FIG. 16 is a view for explaining the function of an exposure apparatus according to the present invention.
Figure 17:
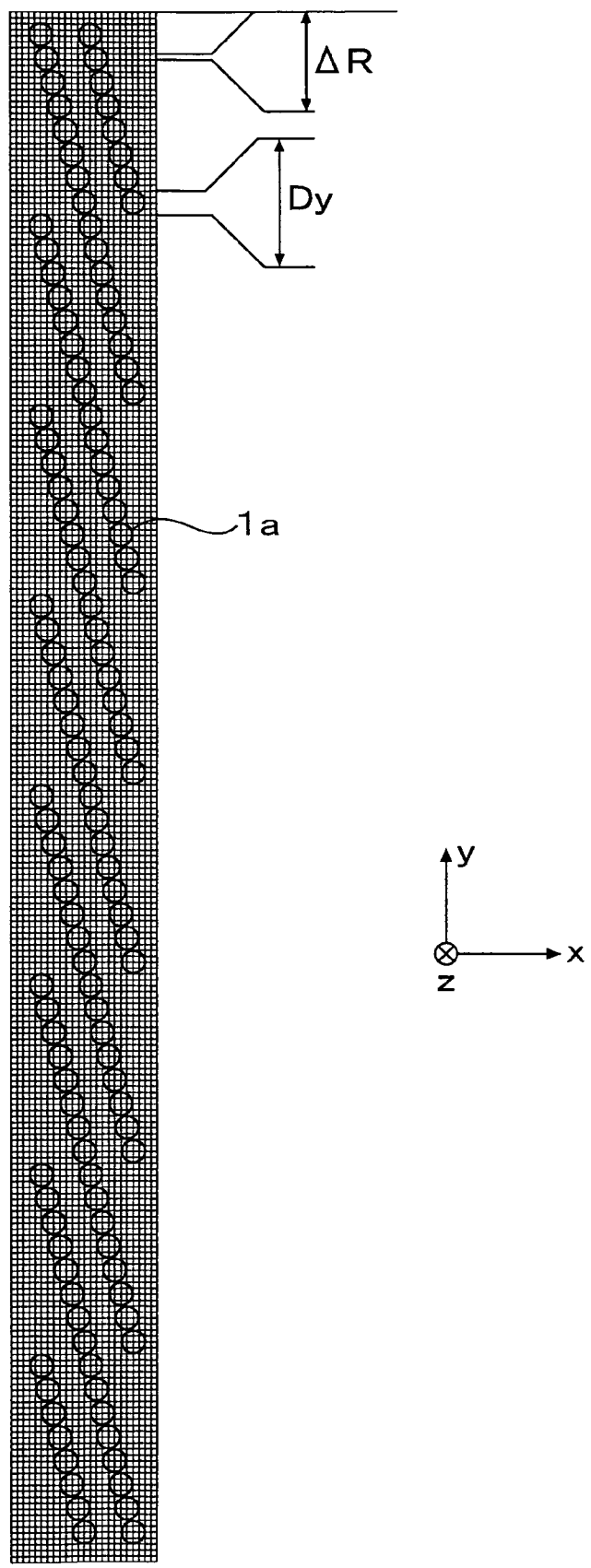
FIG. 17 is a view showing positions where a substrate is irradiated with laser beams.

FIG. 16 is a diagram for explaining the function of the exposure apparatus according to the invention. FIG. 17 is a view showing the positions where the substrate 5 is irradiated with the laser beams 1*a*. Parts the same as or functionally the same as those in FIGS. 3, 5 and 9 are denoted by the same reference numerals correspondingly, and description thereof will be omitted.

A long focus lens system 30 is constituted by a first lens group 301 (one lens is shown in FIG. 16) having a positive power with a long focal length f1, a second lens group 302 with a short focal length f2, a third lens group 303 having a positive power with a long focal length f3, and a cylindrical lens 304 having a positive power.

Next, the operation of this exposure apparatus will be described.

The laser beams 1*a* emitted from the beam-diameter-unchanging beam-pitch-reducing unit 54 in parallel to one another are reflected by a mirror 1001. After that, the laser beams 1*a* pass through the long focus lens system 30, and is incident on the piezo-deflection mirror 22. Then, the laser beams 1*a* reflected by the piezo-deflection mirror 22 are reflected by the polygon mirror 27. After passing through the fθ lens, the optical path of the laser beams 1*a* are bent at 90 degrees by the mirror 28. Due to the cylindrical lens 26 having a power in the x-direction, the laser beams 1*a* serve to scan and irradiate the substrate 5.

The incident positions (multi-spots) of the laser beams 1*a* on the substrate 5 are arrayed as shown in FIG. 17 and FIG. 15C. That is, in FIG. 17, the spots are arrayed in the x-direction (that is, in the sub-scanning direction) with x-direction and y-direction intervals each equal to desired resolution or pixel pitch shown by meshes of ΔR. An array of such multi-spots each having a diameter Dy (equal to the x-direction diameter Dx in FIG. 17) can be formed on the substrate 5. Accordingly, when the multi-spot array is moved by the polygon mirror 27 so as to scan in the y-direction, a pattern having no stripe-like unevenness can be formed.

In order to expose the substrate to light with a desired pattern, the plurality of semiconductor lasers 11 are controlled to be turned ON/OFF individually by the control circuit 3 in accordance with patterning information and the layout of the semiconductor lasers 11. In addition, the ON/OFF control of the semiconductor lasers 11 is synchronized with the rotation of the polygon mirror 27 and the x-direction drive control of the stage 4 on which the substrate 5 is mounted. Further, the stage 4 is controlled so that a region adjacent to a region having been already exposed to the multi-spot array on the substrate 5 is scanned and exposed when the polygon mirror 27 rotates for scanning with its adjacent reflective facet.

In this case, the moving speed of the stage 4 may be controlled so that the region to be exposed overlaps the region which has been already exposed.

The overall configuration and operation described schematically above will be described more in detail. First, description will be made about the imaging relationship of the multi-spots.

As described above, each laser beam 1*a* passing through the beam-diameter-unchanging beam-pitch-reducing unit 54 has an elliptic shape having a minor axis in the y-direction and a major axis in the x-direction and measuring about 1.5 mm by 4 mm. The array pitch of the laser beams 1*a* is 1.5 mm in the y-direction and 1 mm in the x-direction as shown in FIG. 15B. The y-direction focal length of the long focus lens system 30 is 22,000 mm, and the focal length of the polygon mirror 27 is 350 mm. Accordingly, the y-direction spot diameter (width) on the substrate 5 is about 25 μm, and the pitch is also 25 μm.

On the other hand, as for the x-direction, each beam is imaged on the polygon mirror 27 so that the beam diameter of 4 mm is reduced to about 1/50 by the cylindrical lens 304 in the front end of the long focus lens system 30. After that, the beam is imaged with a magnification of about 0.3 by the fθ lens including a cylindrical lens having a power in the x-direction. As a result, on the substrate 5, the spot diameter (width) is 25 μm, and the spot pitch is 6.4 μm.

Accordingly, when the laser beams 1*a* scan the substrate 5 in the y-direction, patterning can be performed with a resolution in which spots of 25 μm are formed at a pitch of 6.4 μm.

In the aforementioned case, the laser beams 1*a* which have passed through the beam-diameter-unchanging beam-pitch-reducing unit 54 have been reduced to about 1/63 in the y-direction and about 1/160 in the x-direction. Accordingly, on the assumption that the parallelism among the laser beams 1*a* immediately after the laser beams 1*a* pass through the beam-diameter-unchanging beam-pitch-reducing unit 54 is Δθ, the parallelism among the laser beams 1*a* on the substrate 5 is a reciprocal of the reduction ratio, that is, 63Δθ in the y-direction and 160Δθ in the x-direction. The focal depth when a spot of 25 μm is formed by a laser beam having a wavelength of 405 nm is about 2 mm. However, in consideration of a variation in thickness of the substrate 5, it is necessary to prevent distortion or misalignment from occurring in an image on the substrate surface within a range of ±φμm from the focus position of the optical system. On the assumption that the quantity of this misalignment is ¼ of pixel pitch, that is, resolution, telecentricity ΔθB on the substrate 5 side is expressed by:

ΔθB=6.4/4/100=0.016rad

Therefore, Δθ is expressed by:

Δθy=0.016rad/63=52 seconds (y-direction)

Δθx=0.016rad/160=20 seconds (x-direction)

In order to attain such parallelism, it is necessary to align the directions of the optical paths of the laser beams 1a.

Next, description will be made about the beam direction fine control unit 53.

Figure 18A:
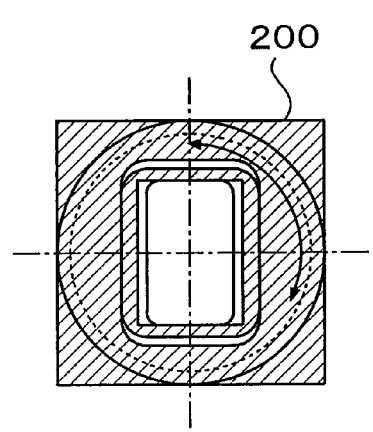
FIGS. 18A-18B are views showing the configuration of a beam direction fine control unit according to the present invention.
Figure 18B:
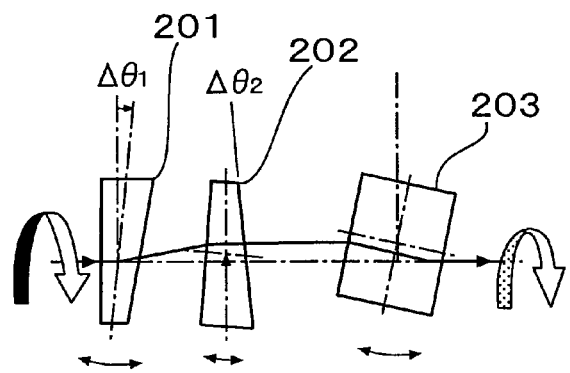

FIGS. 18A-18B are views showing the configuration of a beam direction fine control unit according to the invention. FIG. 18A is a plan view and FIG. 18B is a view for explaining the operation.

A beam direction control unit 200 is constituted by wedged glasses 201 and 202 and a parallel glass 203. Each wedged glass 201, 202 is a transparent glass having a wedge angle of 10° and having an antireflection surface. Assume that the angle of the wedged glass 201 in which the incidence angle of a beam is equal to the emission angle of the beam transmitted is Δθw=0. When the angle of the wedged glass 201 is changed (the wedged glass 202 is fixed) on the assumption that clockwise rotation is regarded as positive, the angle of the optical path of the laser beam 1a transmitted through the wedged glass 202 is changed.

Figure 19:
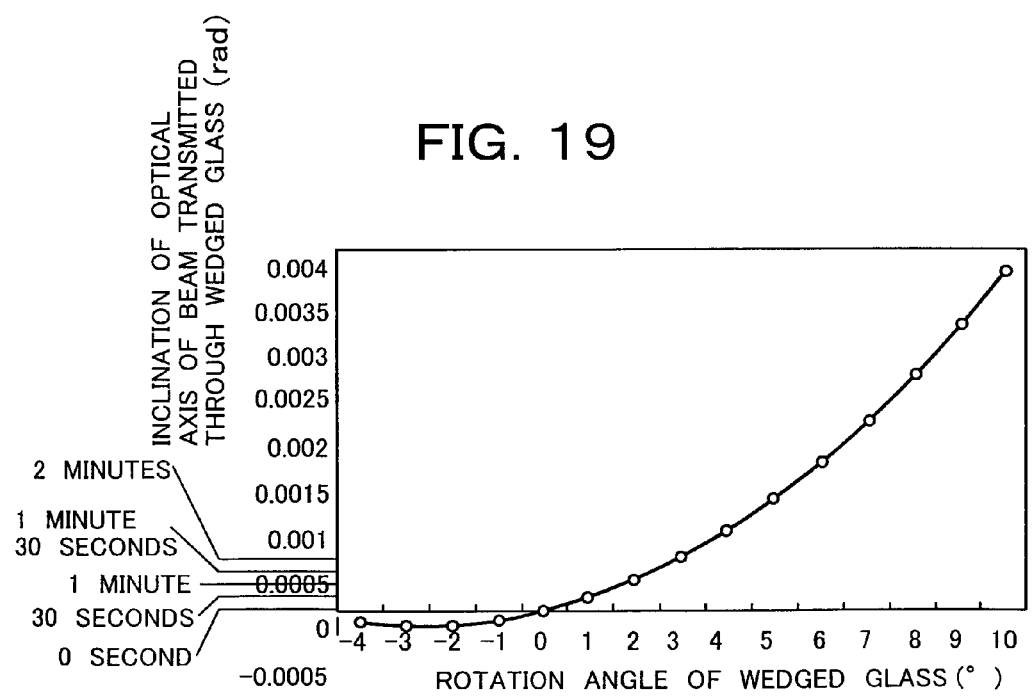
FIG. 19 is a graph showing an angular displacement of the optical path of a laser beam with respect to the rotation angle of a wedged glass according to the present invention.

FIG. 19 is a graph showing the angular displacement of the optical path of a laser beam with respect to the rotation angle of a wedged glass according to the invention.

Now, when there is a misalignment Δx between the emission point of the semiconductor laser 11 and the optical axis of the lens 12 with a focal length fc, a deviation Δθ from telecentricity on the light source side is expressed by Δx/fc. For example, when the focal length fc is 6 mm, the optical axis misalignment Δx has to be set at 0.02 μm in order to satisfy the aforementioned telecentricity of 20 seconds. Such a misalignment cannot be attained.

However, by use of the wedged glasses 201 and 202, the adjustment can be attained by a rotation Δθw of about one degree of the wedged glass 201. That is, when the optical axis misalignment Δx is 5 μm, the deviation Δθ is about 3 minutes for the aforementioned focal length fc (6 mm).

That is, in spite of the deviation Δθ of about 10 minutes caused by the optical axis misalignment (the misalignment Δx is about 10 μm), the optical axis can be corrected to a desired inclination by rotating the wedged glass 201.

As is apparent from FIG. 19, when the rotation angle Δθw of the wedged glass 201 is in a range of from 5 degrees to 10 degrees, one-degree rotation of the wedged glass 201 leads the optical path of the laser beam 1a to tilt at an angle of two or more minutes. Therefore, fine control is difficult. In such a case, a portion with a very small angle corresponding to a low-slope portion of the curve in FIG. 19 can be adjusted by rotating the wedged glass 202 at an angle of several degrees from Δθw=0. By use of this adjustment, final angular alignment can be attained.

When the wedged glass 202 are reversed to the wedged glass 201, the direction of the optical path of the laser beam 1a can be made parallel to its original direction. However, the position is shifted. Accordingly, the parallel glass 203 is inserted so that the shifted optical path of the laser beam 1a is aligned with its original optical path.

Figure 20:
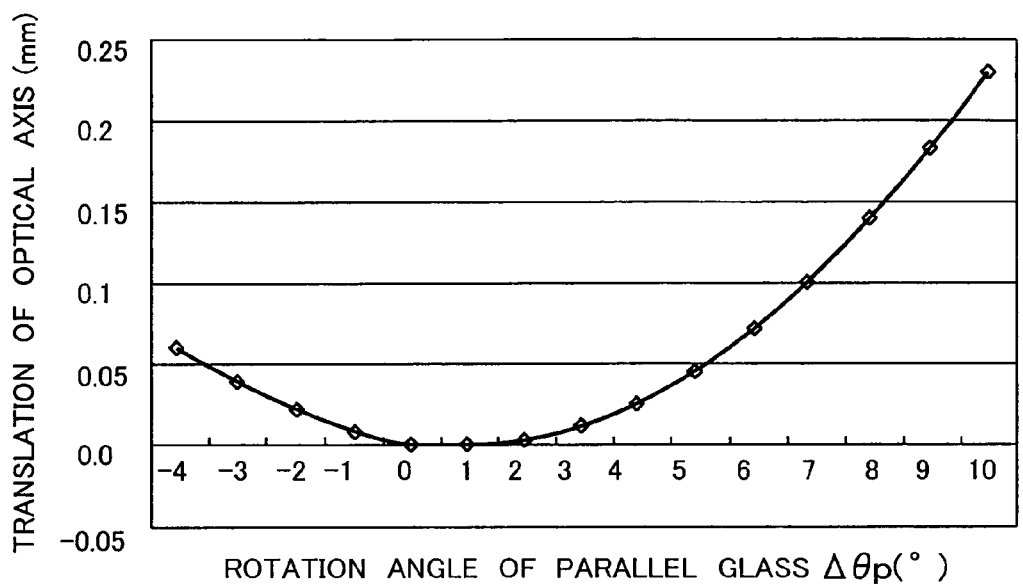
FIG. 20 is a graph showing the relationship between the rotation angle of a parallel glass and the displacement of the optical path of light incident thereon.

FIG. 20 is a graph showing the relationship between the rotation angle of the parallel glass 203 and the displacement of the optical path of light incident thereon. As is apparent from FIG. 20, when the parallel glass 203 is rotated by an angle Δθp, the position of the optical path can be adjusted in a range of several hundreds of micrometers with an accuracy of several tens of micrometers.

The optical path of the laser beam 1a may tilt in various directions. Therefore, the beam direction control unit 200 constituted by the wedged glasses 201 and 202 and the parallel glass 203 is made rotatable at an angle of 360 degrees. With such a configuration, the parallelism can be secured within several tens of minutes even if the optical path of the laser beam 1a tilts at an angle of about 10 minutes in any direction. Thus, the telecentricity of the laser beam 1a incident on the substrate 5 can be adjusted with a high accuracy.

Here, the long focus lens system 30 will be described further.

When the three groups of spherical (more strictly, rotationally symmetric) lenses (focal lengths f1, f2 and f3) constituting the long focus lens system 30 are designed to share a focus between adjacent ones of the groups, the total focal length f is obtained by the following expression.

f=−f1·f3/f2

The fθ lens is small (about several hundreds of millimeters in diameter) while the substrate 5 reaches several hundreds of millimeters or nearly one meter. Accordingly, in order to expose the whole range of the substrate 5 to light, it is necessary to move the substrate 5 in the scanning direction several times or to arrange a plurality of exposure optical systems in the scanning direction. In either case, the width of a scan with the polygon mirror 27 is about a few hundreds of millimeters to 500 mm in consideration of the technical problems in manufacturing the fθ lens and the manufacturing cost thereof.

In addition, due to the roughness or thickness unevenness of the substrate 5 or the positional accuracy of a pattern with which the substrate 5 should be exposed to light, each laser beam 1a has to be telecentrically incident on the substrate 5.

The collimated spot diameter of each semiconductor laser 11 is 1 millimeter to several millimeters, and the array pitch of the multi-spots is about 1 to 10 mm. On the other hand, the spot diameter on the substrate is ten micrometers to several tens of micrometers, and the array pitch thereon is about 5 to 100 micrometers. From such a relationship of magnification, the focal length f of the long focus lens system is several meters to several tens of meters. In order to realize such a long focus lens system with a short lens-barrel length, the system has the aforementioned three group configuration. From the aforementioned focus length expression, it is practical that the system is constituted by a first group having a positive power with a focal length not shorter than 200 mm, a second group with a focal length not longer than 20 mm, and a third group having a positive power with a focal length not shorter than 200 mm.

With this configuration, a lens with a long focal length not shorter than several thousands of millimeters in the y-direction can be realized with a lens-barrel length of about 360 mm.

In consideration of a variation in wavelength among beams emitted from the semiconductor lasers, color correction is required. In the aforementioned lens system comprised of three groups of spherical lens systems, color correction can be achieved comparatively easily by combining lenses whose materials are different in refractive index.

On the other hand, as for the x-direction, that is, the sub-scanning direction, a cylindrical lens having a positive power is included in the aforementioned spherical lens systems (spherical or rotationally symmetric lens systems comprised of a plurality of lenses with spherical or rotationally symmetric surfaces), while a cylindrical lens having a positive power in the x-direction is included in the fθ lens. Color correction is dispensable when the x-direction width on the substrate is narrow.

Fifth Embodiment

Description will be made below about a fifth embodiment of the present invention.

Figure 21:
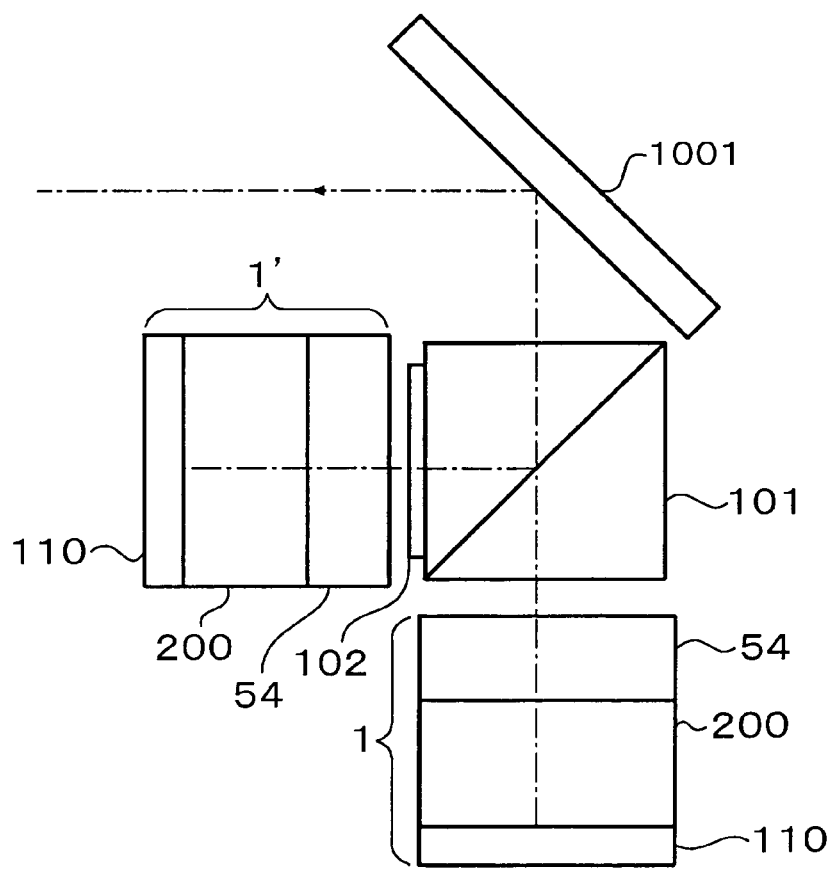
FIG. 21 is a configuration view of a secondary light source forming optical system showing an embodiment of the present invention.
Figure 22A:
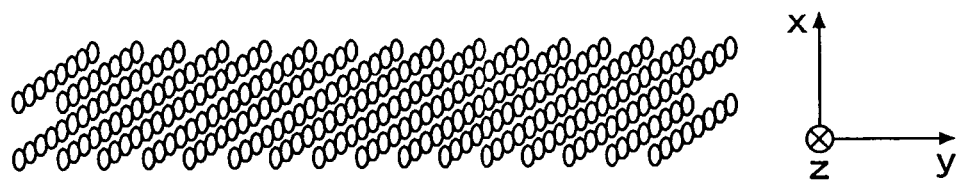
FIGS. 22A-22B are views showing the position relationship among laser beams.
Figure 22B:
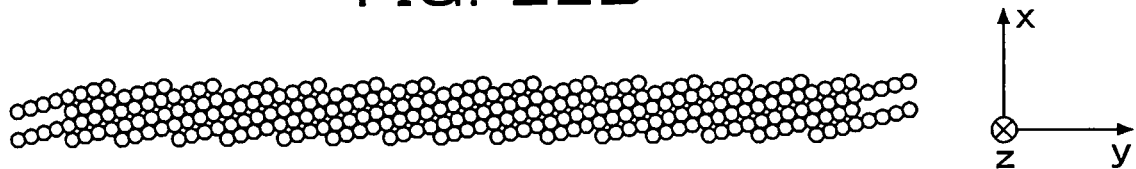

FIG. 21 is a configuration diagram of a secondary light source forming optical system showing the fifth embodiment of the invention. FIGS. 22A-22B are views showing the positional relationship of laser beams. Parts the same as or functionally the same as those in FIG. 16 are denoted by the same reference numerals correspondingly, and redundant description thereof will be omitted.

A light source system 1 is constituted by a semiconductor laser holder substrate 110 holding a large number of semiconductor lasers 11, a beam direction control unit 200 and a beam-diameter-unchanging beam-pitch-reducing unit 54. The light source system 1 and a second light source system 1' having the same configuration as the light source system 1 are disposed perpendicularly to each other. Parallel multi-beams obtained from the light source system 1' are made incident on a polarizing beam splitter 101 through a half-wave plate 102.

Next, the operation of this embodiment will be described.

Laser beams 1a emitted from the light source system 1 are incident on the polarizing beam splitter 101 as P-polarized light. The laser beams 1a are substantially 100% transmitted. On the other hand, laser beams 1a emitted from the light source system 1' are incident on the polarizing beam splitter 101 as S-polarized light due to the half-wave plate 102. The laser beams 1a are substantially 100% reflected. As a result, the laser beams 1a emitted from the two light source systems can be used without loss.

As shown in FIGS. 22A-22B, the multi-spots from the light source systems 1, 1' are aligned to be incident on positions shifted from each other by half pitch. As a result, as shown in FIG. 22A, 16 spots are arrayed in the scanning direction y, and 16 spots are arrayed in the sub-scanning direction x.

FIG. 22B shows the multi-spots on the substrate 5.

The multi-spots from the light source systems 1 and 1' are not aligned to be incident on positions shifted from each other by half pitch, but may be arranged in parallel in the sub-scanning direction. Thus, 8 spots can be arrayed in the scanning direction while 32 spots are arrayed in the sub-scanning direction.

Figure 23A:
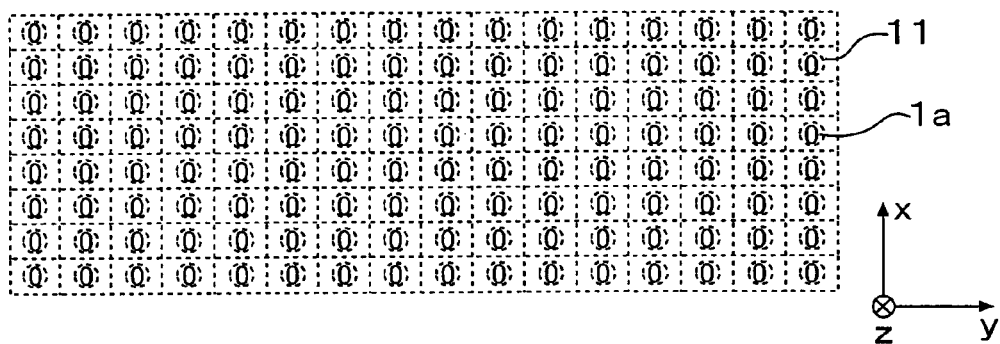
Figure 23A:
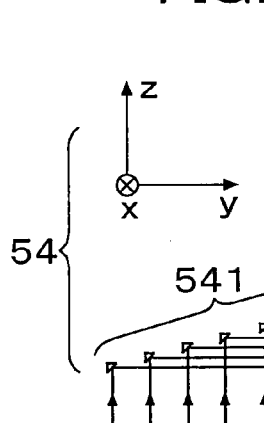
Figure 23A:
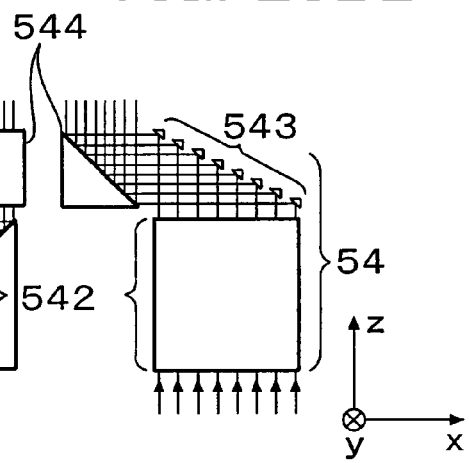

FIGS. 23A-23D are diagrams for explaining the function of the exposure apparatus according to the invention. FIG. 23A shows arrays of 128 collimated laser beams 1a (that is, the arrays of the semiconductor lasers 11 in the semiconductor laser holder substrate 110).

FIGS. 23B1 and 23B2 are diagrams in which the beam-diameter-unchanging beam-pitch-reducing unit 54 is viewed from the two directions perpendicular to the optical axis. By use of mirror systems 541, 542, 543 and 544, the array pitch is reduced to ¼ in the scanning direction y and to about ½ in the sub-scanning direction x without changing the shapes of the laser beams 1a.

Figure 23C:
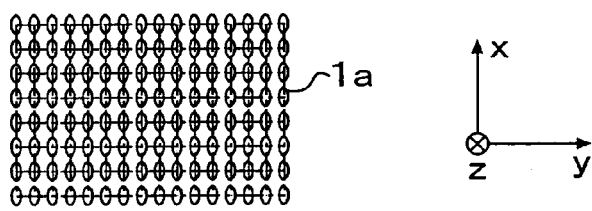

FIG. 23C shows arrays of laser beams 1a emitted from the beam-diameter-unchanging beam-pitch-reducing unit 54.

Figure 23D:
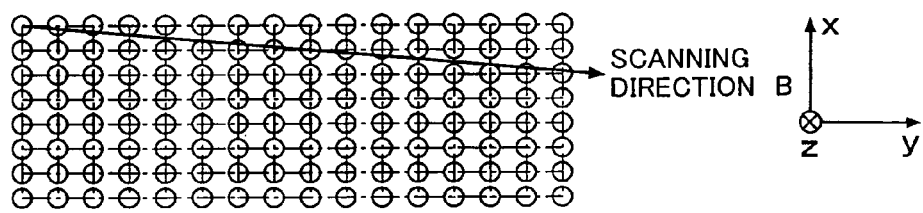

FIG. 23D shows the positions where the substrate 5 is irradiated with the laser beams 1a emitted from the beam-diameter-unchanging beam-pitch-reducing unit 54 and passing through the long focus lens 30 and the fθ lens shown in FIG. 16.

By rotating the polygon mirror 27 and moving the stage 4, the angles of the laser beams are adjusted so that the substrate 5 is scanned with multi-spots thereof as shown by the arrow in FIG. 23D. In such a manner, the pixel pitch corresponds to ¼ of the spot diameter. Thus, unevenness is eliminated, and any point on the substrate 5 is exposed to two laser beams 1a.

Although the aforementioned embodiment shows a hexahedron as an example of the polygon mirror which is a polyhedron, it may be formed as a decahedron or a dodecahedron.

For example, when the range of the angle of deflection is 34.4°, the utilization efficiency of light reaches 38% in an octahedron, 48% in a decahedron and 57% in a dodecahedron as compared with 29% in a hexahedron. Thus, the efficiency can be improved on a large scale.

What is claimed is:

1. A pattern exposure method comprising:
    scanning over a workpiece with a plurality of outgoing beams emitted from light sources wherein respective beam spots of the plurality of outgoing beams are arranged in a parallelogramic array and wherein opposing sides of the array are parallel to a line of the scanning so as to expose said workpiece to said outgoing beams to thereby draw a pattern on said workpiece;
    wherein a desired place on the workpiece is exposed to at least two of the beam spots from the plurality of outgoing beams.

2. A pattern exposure method according to claim 1, wherein said light sources are semiconductor lasers.

3. A pattern exposure method according to claim 2, wherein said semiconductor lasers are provided corresponding to said light sources respectively.

4. A pattern exposure method according to claim 2, wherein wavelengths of said semiconductor lasers are not longer than 410 nm.

5. A pattern exposure apparatus comprising:
    a plurality of semiconductor lasers;
    collimator lenses for collimating a plurality of outgoing beams emitted from said plurality of semiconductor lasers respectively;
    a multi-beam parallelizing optical unit for parallelizing a plurality of collimated beams emitted from said collimator lens;
    a multi-beam spot forming optical system for reducing said plurality of collimated beams parallel to one another, in two directions perpendicular to optical paths of said beams, such that respective beam spots of the plurality of outgoing beams are arranged in a parallelogramic array and wherein opposing sides of the array are parallel to a line of the scanning;
    a stage on which a substrate is mounted, on which multi-spots formed by said multi-beam spot forming optical system are exposed;
    a scanning unit for performing a relative scan between said multi-spots and said stage such that a desired place on the workpiece is exposed to at least two of the beam spots from the plurality of outgoing beams; and a control circuit for turning on/off said plurality of semiconductor lasers in accordance with a desired pattern to be drawn by exposure, a layout of said semiconductor lasers and a velocity of said relative scan.

6. A pattern exposure apparatus according to claim 5, wherein said multi-beam parallelizing optical unit includes a beam-diameter-unchanging beam-pitch-reducing unit for reducing a beam pitch of said collimated beams in a sub-scanning direction perpendicular to a scanning direction of said scan without changing beam diameters of said collimated beams.

7. A pattern exposure apparatus according to claim 6, wherein said beam-diameter-unchanging beam-pitch-reducing unit is comprises two reflective surface sets each including two flat reflective surfaces, and said reflective surface sets are different in distance between said reflective surfaces.

8. A pattern exposure apparatus according to claim 7, wherein a telecentric reduction optical system includes a deflection unit, and for any beam on said deflection unit, conjugation among light sources, said deflection unit and said substrate to be exposed is established with respect to a direction perpendicular to a direction of deflection.

9. A pattern exposure apparatus according to claim 8, wherein said telecentric reduction optical system is comprises a long focus lens including at least one cylindrical lens and having a positive power with a focal length fy in said scanning direction and a positive power with a focal length fx in said sub-scanning direction, and an fθ lens including a cylindrical lens having a positive power in said sub-scanning direction.

10. A pattern exposure apparatus according to any one of claims 5 to 9, wherein said multi-beam parallelizing optical unit includes a beam direction fine control unit comprises of a wedged glass disposed in an optical path of said collimated beams.

11. A pattern exposure apparatus according to claims 10, wherein said beam direction fine control unit includes a beam position fine control unit for rotating a parallel glass to thereby finely control positions of said beams.

12. A pattern exposure apparatus according to claim 10, wherein said wedged glass comprises two wedged glasses.

13. A pattern exposure apparatus according to claim 8 or 9, wherein said reduction optical system comprise a long focus lens system including cylindrical lenses having a positive power with a focal length not shorter than 2,000 mm in a first direction and a positive power in a second direction perpendicular to said first direction and comprises a first group having a positive power with a focal length not shorter than 200 mm, a second group with a focal length not longer than 20 mm and a third group having a positive power with a focal length not shorter than 200 mm, said fθ lens including a cylindrical lens and having a positive power in said second direction.

* * * * *